(12) United States Patent
Zhao et al.

(10) Patent No.: US 12,204,189 B2
(45) Date of Patent: Jan. 21, 2025

(54) MANUFACTURING METHOD OF DISPLAY DEVICE, DISPLAY DEVICE, AND SPLICED DISPLAY DEVICE

(71) Applicant: TCL CHINA STAR OPTOELECTRONICS TECHNOLOGY CO., LTD., Guangdong (CN)

(72) Inventors: Jun Zhao, Guangdong (CN); Bin Zhao, Guangdong (CN); Juncheng Xiao, Guangdong (CN); Hongyuan Xu, Guangdong (CN); Huajun Lu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/622,226

(22) PCT Filed: Dec. 16, 2021

(86) PCT No.: PCT/CN2021/138925
§ 371 (c)(1),
(2) Date: Dec. 22, 2021

(87) PCT Pub. No.: WO2023/103021
PCT Pub. Date: Jun. 15, 2023

(65) Prior Publication Data
US 2024/0036375 A1    Feb. 1, 2024

(30) Foreign Application Priority Data
Dec. 10, 2021 (CN) .......................... 202111508616.6

(51) Int. Cl.
G02F 1/1333 (2006.01)
G02F 1/1345 (2006.01)
H01L 25/075 (2006.01)

(52) U.S. Cl.
CPC .... G02F 1/13336 (2013.01); G02F 1/133388 (2021.01); G02F 1/13458 (2013.01); H01L 25/0753 (2013.01)

(58) Field of Classification Search
CPC .......... G02F 1/13336; G02F 1/133388; G02F 1/13458; H01L 25/0753
See application file for complete search history.

(56) References Cited

U.S. PATENT DOCUMENTS

2008/0036940 A1* 2/2008 Song ................. G02F 1/133608
362/249.16
2012/0287021 A1   11/2012 Park et al.
(Continued)

FOREIGN PATENT DOCUMENTS

CN    103514820 A    1/2014
CN    109859646 A    6/2019
(Continued)

OTHER PUBLICATIONS

International Search Report in International application No. PCT/CN2021/138925, mailed on May 26, 2022.
(Continued)

*Primary Examiner* — Mariam Qureshi
(74) *Attorney, Agent, or Firm* — PV IP PC; Wei Te Chung (57) ABSTRACT

A manufacturing method of a display device, the display device, and a spliced display device are disclosed. The display device includes a liquid crystal display panel (LCD display panel), a plurality of pad units, a plurality of conductive units, and a plurality of mini light-emitting diodes
(Continued)

(mini-LEDs). The mini-LEDs are manufactured in a bezel area of the LCD display panel to allow the bezel area of the LCD display panel which does not emit light and display originally to display by the mini-LEDs, thereby improving a screen ratio of the display device and improving product competitiveness of the spliced display device.

1 Claim, 6 Drawing Sheets

(56) References Cited

U.S. PATENT DOCUMENTS

| | | | | |
|---|---|---|---|---|
| 2018/0088389 | A1* | 3/2018 | Furuta | B23K 1/0008 |
| 2019/0109174 | A1* | 4/2019 | Chu | H01L 27/156 |
| 2021/0063803 | A1* | 3/2021 | Kim | G02F 1/13458 |
| 2021/0109389 | A1* | 4/2021 | Fan | G02F 1/1362 |

FOREIGN PATENT DOCUMENTS

| | | |
|---|---|---|
| CN | 111063693 A | 4/2020 |
| CN | 111463229 A | 7/2020 |
| CN | 112634777 A | 4/2021 |
| CN | 113674636 A | 11/2021 |
| CN | 113703211 A | 11/2021 |
| CN | 113703223 A | 11/2021 |
| KR | 20060085311 A | 7/2006 |

OTHER PUBLICATIONS

Written Opinion of the International Search Authority in International application No. PCT/CN2021/138925, mailed on May 26, 2022.

Chinese Office Action issued in corresponding Chinese Patent Application No. 202111508616.6 dated Dec. 16, 2022, pp. 1-8.

* cited by examiner

MANUFACTURING METHOD OF DISPLAY DEVICE, DISPLAY DEVICE, AND SPLICED DISPLAY DEVICE

FIELD OF INVENTION

The present disclosure relates to the field of display technologies, and more particularly, to a manufacturing method of a display device, the display device, and a spliced display device.

BACKGROUND OF INVENTION

At present, a market size of spliced display devices has grown year by year. In spliced display devices of light-emitting diode (LED) display panels, seams between display areas of adjacent LED display panels are smaller, thereby occupying a high-end market of the spliced display devices. In spliced display devices of liquid crystal display panels (LCD display panels), seams between display areas of adjacent LCD display panels are larger, so the LCD display panels only can occupy a middle to low-end market of the spliced display devices by price advantages of the LCD display panels. Therefore, reducing or even eliminating the seams between the display areas of the adjacent LCD display panels in the spliced display devices of the LCD display panels to expand a rimless area of large-size LCD display panels, thereby improving product competitiveness of the spliced display devices of the LCD display panels. That is, they can occupy the high-end market of the spliced display devices of the LED display panels, such as broadcasting media, big data centers, by advantages of prices and small seams.

Technical problem: at present, the seams between the display areas of the adjacent LCD display panels are usually eliminated by mixing the large-size LCD display panels with mini-LEDs.

In general, solder pastes are printed on the LCD display panels, then the mini-LEDs are manufactured on the solder pastes, and then the LCD display panels are bonded to the mini-LEDs by reflow soldering. Since reflow soldering cannot heat locally, the LCD display panels will be heated together by reflow soldering. In general, a temperature of reflow soldering is greater than 180° C., while liquid crystal molecules of liquid crystal layers of the LCD display panels will be irreversibly decomposed at a temperature greater than 120° C., and polarizers of the LCD display panels will lose effectiveness at a temperature greater than 120° C. over 2 minutes, thereby affecting display effect of the LCD display panels at last. in addition, when the solder pastes are printed on the large-size LCD display panels, a size of steel mesh needs to be increased. If the size of the steel mesh is larger, due to influences of its own weight, the steel mesh will bend, which causes an amount of the solder pastes to be not able to be controlled and resulting in offset of printed solder pastes, thereby causing the printed solder pastes to have a ghosting phenomenon.

SUMMARY OF INVENTION

An objective of the present disclosure is to provide a manufacturing method of a display device, the display device, and a spliced display device to solve problems of liquid crystal layers and polarizers of LCD display panels losing effectiveness caused by a high temperature of reflow soldering in processes of bonding mini-LEDs to the LCD display panels in current technology, which affects display effect of the LCD display panels.

In order to solve above problems, the present disclosure provides a manufacturing method of a display device, which includes following steps: providing a LCD display panel including a display area and a bezel area; manufacturing a plurality of pad units spaced apart from each other in the bezel area of the LCD display panel; manufacturing a plurality of conductive units spaced apart from each other on one side of the pad units away from the LCD display panel, wherein, the conductive units are correspondingly electrically connected to the pad units by one to one, and a material of the conductive units is an anisotropic conductive adhesive or a solder paste; and manufacturing a plurality of mini light-emitting diodes (mini-LEDs) spaced apart from each other on one side of the conductive units away from the LCD display panel, wherein, the mini-LEDs are electrically connected to the pad units.

Further, the step of manufacturing the plurality of conductive units spaced apart from each other on the side of the pad units away from the LCD display panel includes a following step: attaching an anisotropic conductive adhesive film onto the side of the pad units away from the LCD display panel, wherein, the anisotropic conductive adhesive film covers the LCD display panel between adjacent pad units.

Further, the step of manufacturing the plurality of conductive units spaced apart from each other on the side of the pad units away from the LCD display panel further includes a following step: melting the anisotropic conductive adhesive film corresponding to the pad units by hot pressing to form the conductive units correspondingly electrically connected to the pad units by one to one.

Further, the step of manufacturing the plurality of conductive units spaced apart from each other on the side of the pad units away from the LCD display panel further comprises a following step: the anisotropic conductive adhesive film not corresponding to the pad units forms a plurality of insulating units disposed interlaced with the conductive units.

Further, the step of manufacturing the plurality of conductive units spaced apart from each other on the side of the pad units away from the LCD display panel includes a following step: printing solder pastes on the side of the pad units away from the LCD display panel by inkjet printing, wherein, the solder pastes correspond to the pad units by one to one.

Further, the step of manufacturing the plurality of conductive units spaced apart from each other on the side of the pad units away from the LCD display panel further comprises a following step: melting the solder pastes between the pad units and the mini-LEDs by laser heating to form the conductive units correspondingly electrically connected to the pad units by one to one.

In order to solve the above problems, the present disclosure provides a display device, which includes: an LCD display panel including a display area and a bezel area; a plurality of pad units disposed spaced apart from each other in the bezel area of the LCD display panel; a plurality of conductive units disposed spaced apart from each other on one side of the pad units away from the LCD display panel and correspondingly electrically connected to the pad units by one to one; and a plurality of mini-LEDs disposed spaced apart from each other on one side of the conductive units away from the LCD display panel in the bezel area and electrically connected to the conductive units; wherein, a material of the conductive units is an anisotropic conductive adhesive or a solder paste.

Further, the material of the conductive units is the anisotropic conductive adhesive; and the display device further includes: a plurality of insulating units disposed interlaced with the conductive units.

Further, a thickness of the conductive units ranges from 30 um to 60 um.

In order to solve the above problems, the present disclosure provides a spliced display device, which includes a plurality of display devices related to the present disclosure being spliced to each other.

Beneficial effect: in the display device of the present disclosure, the mini-LEDs are manufactured in the bezel area of the LCD display panel to allow the bezel area of the LCD display panel which does not emit light and display originally to display by the mini-LEDs, thereby improving a screen ratio of the display device, further eliminating seams between display areas of two adjacent LCD display panels of the spliced display device, and improving product competitiveness of the spliced display device.

The anisotropic conductive adhesive film is attached onto the pad units in the present disclosure, then the mini-LEDs are manufactured on the anisotropic conductive adhesive film, and then the anisotropic conductive adhesive film corresponding to the pad units are melted by hot pressing to form the conductive units that are spaced apart from each other. Since hot pressing can heat locally, the LCD display panel will not be heated together. Therefore, a ghosting phenomenon when the solder pastes are printed in current technology can be prevented, and display effect of the LCD display panel being affected by reflow soldering in current technology can be prevented.

The solder pastes are printed on the pad units by inkjet printing in the present disclosure, then the mini-LEDs are manufactured on the solder pastes, and then the solder pastes between the pad units and the mini-LEDs are melted by laser heating to form the conductive units that are spaced apart from each other. Since laser heating can heat locally, the LCD display panel will not be heated together. Therefore, the ghosting phenomenon when the solder pastes are printed in current technology can be prevented, and the display effect of the LCD display panel being affected by reflow soldering in current technology can be prevented.

DESCRIPTION OF DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

Elements in the drawings are designated by reference numerals listed below.

100: spliced display device; 200: display device;
1: LCD display panel; 2: pad unit;
3: conductive unit; 4: mini-LED;
5: insulating unit; 6: anisotropic conductive adhesive film;
7: mold; 8: solder paste;
101: display area; 102: bezel area;
11: array substrate; 12: color filter substrate;
13: liquid crystal layer; 14: first polarizer;
15: second polarizer; and 16: sealant.

DETAILED DESCRIPTION OF PREFERRED EMBODIMENTS

The preferred embodiments of the present disclosure are described in detail below with reference to the accompanying drawings. The specific embodiments described with reference to the attached drawings are all exemplary and are intended to illustrate and interpret the present disclosure to make the skilled in the art easier to understand how to implement the present disclosure. The disclosure herein provides many different embodiments or examples for realizing different structures of the present disclosure. They are only examples and are not intended to limit the present disclosure.

In the description of the present disclosure, it should be understood that terms such as "upper," "lower," "front," "rear," "left," "right," "inside," "outside," "side," as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure.

In the accompanying drawings, wherein the identical or similar reference numerals constantly denote the identical or similar elements or elements having the identical or similar functions. In the drawings, structurally identical components are denoted by the same reference numerals, and structural or functionally similar components are denoted by like reference numerals. Moreover, a size and a thickness of each component shown in the drawings are arbitrarily shown for ease of understanding and description, and the present disclosure does not limit the size and thickness of each component.

Figure 1:
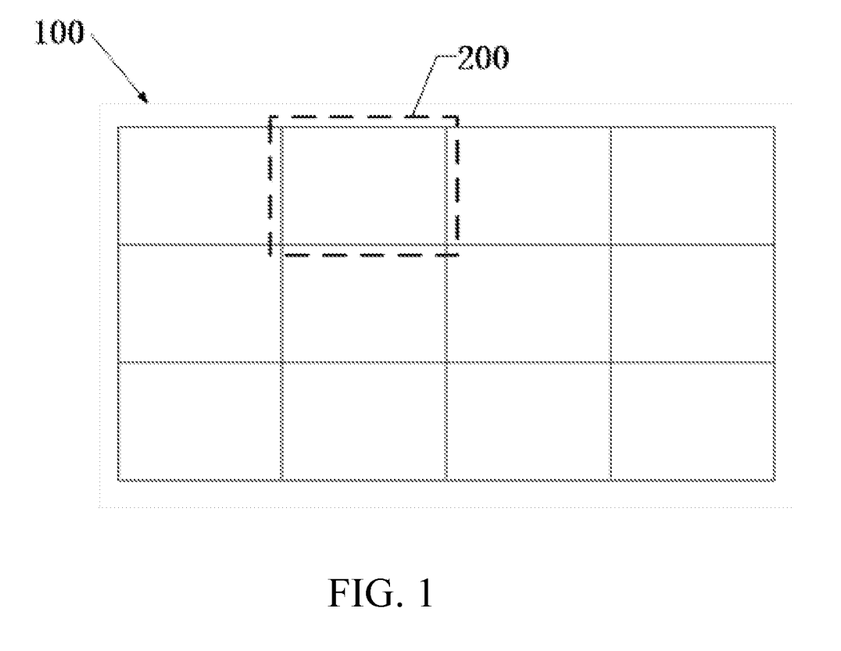
FIG. 1 is a schematic planar diagram of a spliced display device according to an embodiment of the present disclosure.

As shown in FIG. 1, the present disclosure provides a spliced display device 100. The spliced display device 100 includes a plurality of display devices 200 that are spliced to each other.

Embodiment 1

Figure 2:
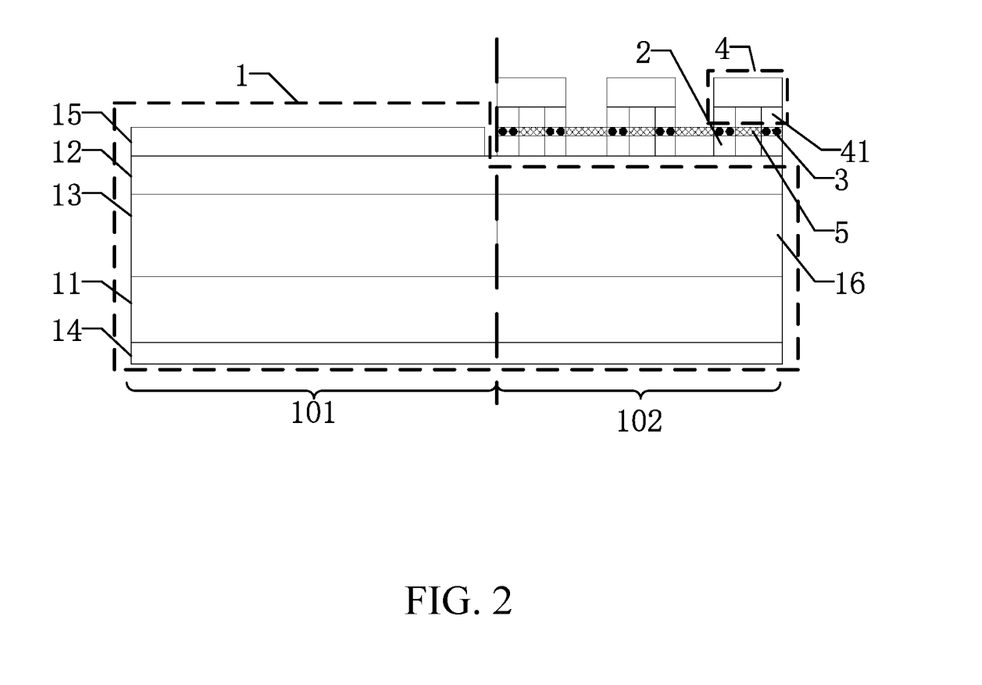
FIG. 2 is a schematic structural diagram of a display device according to embodiment 1 of the present disclosure.

As shown in FIG. 2, a display device 200 of this embodiment includes an LCD display panel 1, a plurality of pad units 2, a plurality of conductive units 3, a plurality of mini-LEDs 4, and a plurality of insulating units 5.

In the display device of this embodiment, the mini-LEDs 4 are manufactured in a bezel area 102 of the LCD display panel 1 to allow the bezel area 102 of the LCD display panel 1 which does not emit light and display originally to display by the mini-LEDs 4, thereby improving a screen ratio of the display device 200, further eliminating seams between display areas 101 of two adjacent LCD display panels 1 of the spliced display device 100, and improving product competitiveness of the spliced display device 100.

As shown in FIG. 2, the LCD display panel 1 is defined with the display area 101 and the bezel area 102.

Wherein, the LCD display panel 1 includes an array substrate 11, a color filter substrate 12, a liquid crystal layer 13, a first polarizer 14, a second polarizer 15, and a sealant 16.

Wherein, the array substrate 11 is disposed in the display area 101 and the bezel area 102. The array substrate 11 includes film layer structures such as a first substrate, a thin film transistor layer, and a first electrode.

Wherein, the color filter substrate 12 is disposed opposite to the array substrate 11, and the color filter substrate 12 is disposed in the display area 101 and the bezel area 102. The color filter substrate 12 includes film layer structures such as a second substrate, a color filter, a black matrix, and a second electrode.

Wherein, the liquid crystal layer 13 is disposed between the array substrate 11 and the color filter substrate 12, and is located in the display area 101.

The first polarizer 14 is disposed on one side of the array substrate 11 away from the color filter substrate 12, and is located in the display area 101 and the bezel area 102. A structure of the first polarizer 14 includes two layers of triacetyl cellulose (TAC) and one polyvinyl alcohol (PVA) layer disposed between the two layers of TAC. It is the PVA layer that plays the role of polarization, but PVA is easily hydrolyzed. In order to protect physical properties of polarizers, it is necessary to laminate one TAC film having high light transmittances, good water resistances, and certain mechanical strengths on both sides of the PVA layer for protection.

The second polarizer 15 is disposed on one side of the color filter substrate 12 away from the array substrate 11, and is located in the display area 101. A structure of the second polarizer 15 includes two layers of triacetyl cellulose (TAC) and one polyvinyl alcohol (PVA) layer disposed between the two layers of TAC. It is the PVA layer that plays the role of polarization, but PVA is easily hydrolyzed. In order to protect physical properties of polarizers, it is necessary to laminate one TAC film having high light transmittances, good water resistances, and certain mechanical strengths on both sides of the PVA layer for protection.

The sealant 16 is disposed between the array substrate 11 and the color filter substrate 12, surrounds the liquid crystal layer 13, and is located in the bezel area 102.

The pad units 2 are disposed spaced apart from each other in the bezel area 102 of the LCD display panel 1. In this embodiment, the pad units 2 are disposed spaced apart from each other on one side of the color filter substrate 12 away from the array substrate 11.

The conductive units 3 are disposed spaced apart from each other on one side of the pad units 2 away from the LCD display panel 1. In this embodiment, the conductive units 3 are disposed spaced apart from each other on one side of the pad units 2 away from the color filter substrate 12. The conductive units 3 are correspondingly electrically connected to the pad units 2 by one to one. In this embodiment, a material of the conductive units 3 is an anisotropic conductive adhesive (ACF). A thickness of the conductive units 3 ranges from 30 um to 60 um. Therefore, electrical connections between the pad units 2 and the mini-LEDs 4 can be well realized.

The mini-LEDs 4 are disposed spaced apart from each other on one side of the conductive units 3 away from the LCD display panel 1. Each of the mini-LEDs 4 includes two connecting ends 41. The connecting ends 41 are correspondingly electrically connected to the conductive units 3 by one to one.

The insulating units 5 are disposed interlaced with the conductive units 3. In this embodiment, a material of the insulating units 5 is same as that of the conductive units 3.

Figure 3:
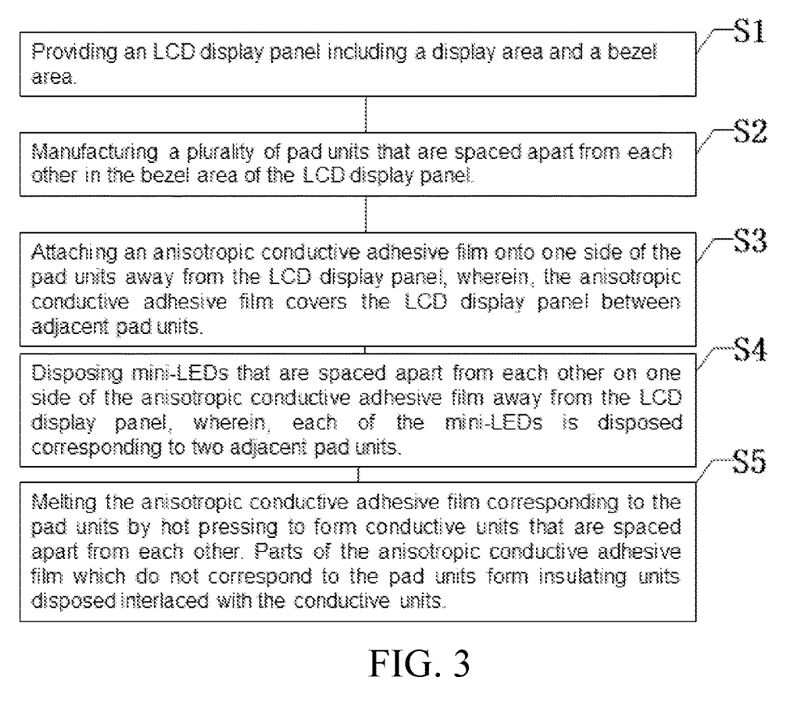
FIG. 3 is a flowchart of manufacturing steps of the display device according to embodiment 1 of the present disclosure.
Figure 4:
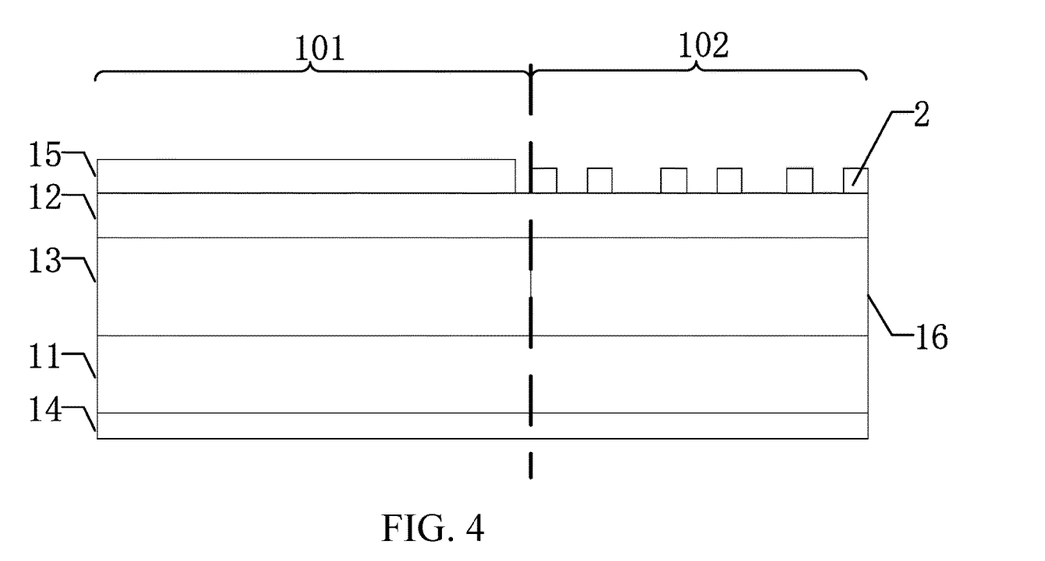
FIG. 4 is a schematic structural diagram of manufacturing pad units in a bezel area of an LCD display panel according to an embodiment of the present disclosure.

As shown in FIGS. 3 and 4, a manufacturing method of the display device is further provided in this embodiment, which includes following steps: S1: providing the LCD display panel 1 including the display area 101 and the bezel area 102; and S2: manufacturing the plurality of pad units 2 that are spaced apart from each other in the bezel area 102 of the LCD display panel 1.

Figure 5:
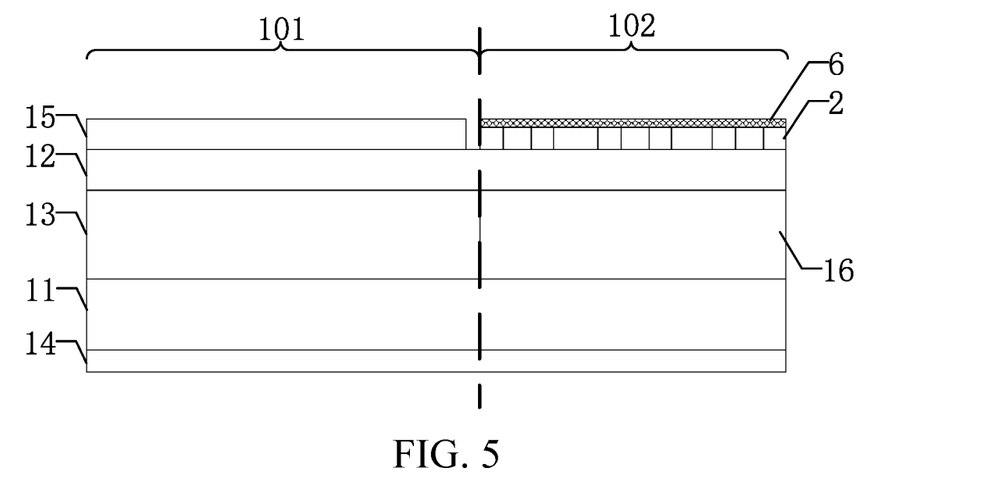
FIG. 5 is a schematic structural diagram of attaching an anisotropic conductive adhesive film onto the pad units according to embodiment 1 of the present disclosure.

As shown in FIGS. 3 and 5, the manufacturing method of the display device in this embodiment also includes a step of S3: attaching an anisotropic conductive adhesive film 6 onto one side of the pad units 2 away from the LCD display panel 1, wherein, the anisotropic conductive adhesive film 6 covers the LCD display panel 1 between adjacent pad units 2.

Figure 6:
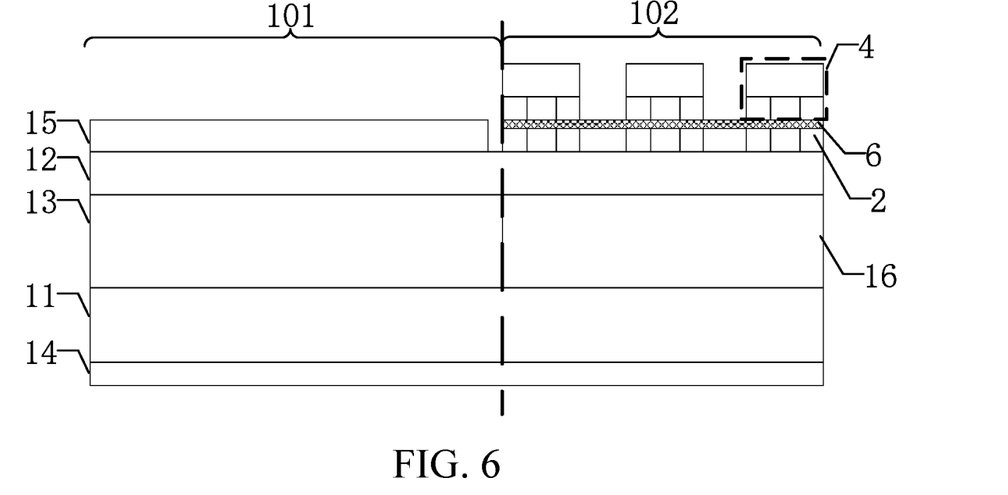
FIG. 6 is a schematic structural diagram of manufacturing mini-LEDs on the anisotropic conductive adhesive film according to embodiment 1 of the present disclosure.

As shown in FIGS. 3 and 6, the manufacturing method of the display device in this embodiment also includes a step of S4: disposing the mini-LEDs 4 that are spaced apart from each other on one side of the anisotropic conductive adhesive film 6 away from the LCD display panel 1, wherein, each of the mini-LEDs 4 is disposed corresponding to two adjacent pad units 2.

Figure 7:
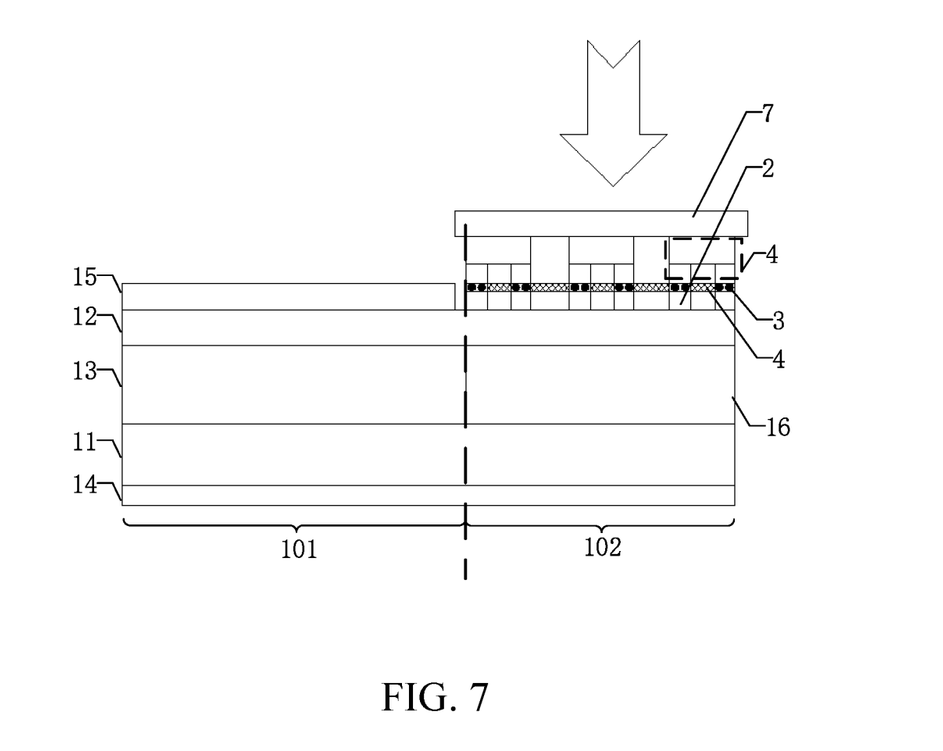
FIG. 7 is a schematic structural diagram of melting the anisotropic conductive adhesive film between the pad units and the mini-LEDs by hot pressing to form conductive units according to embodiment 1 of the present disclosure.

As shown in FIGS. 3 and 7, the manufacturing method of the display device in this embodiment also includes a step of S5: melting the anisotropic conductive adhesive film 6 corresponding to the pad units 2 by hot pressing to form the conductive units 3 that are spaced apart from each other. Parts of the anisotropic conductive adhesive film 6 which do not correspond to the pad units 2 form the insulating units 5 disposed interlaced with the conductive units 3. The conductive units 3 correspond to the pad units 2 by one to one.

Specifically, the anisotropic conductive adhesive film 6 is heated with a mold 7 to melt the anisotropic conductive adhesive film 6, and the mold 7 is used to squeeze the mini-LEDs 4 and the pad units 2 to allow the mini-LEDs 4 and the pad units 2 to be tightly bonded. After hot pressing, insulating shells of parts of the anisotropic conductive adhesive film 6 corresponding to the pad units 2 will be broken to expose internal metal conductive particles, thereby realizing electrical conduction and realizing electrical connections between the pad units 2 and the mini-LEDs 4. Insulating shells of parts of the anisotropic conductive adhesive film 6 which do not correspond to the pad units 2 will not be broken, thereby being unable to conduct electricity, which form the insulating units 5.

Since hot pressing can heat locally, the LCD display panel 1 will not be heated together. Therefore, a ghosting phenomenon when solder pastes are printed in current technology can be prevented, malfunction of the liquid crystal layer 13, the first polarizer 14, and the second polarizer 15 of the LCD display panel 1 caused by reflow soldering in current technology can be prevented, and thereby preventing the display effect of the LCD display panel 1 from being affected.

Embodiment 2

Figure 8:
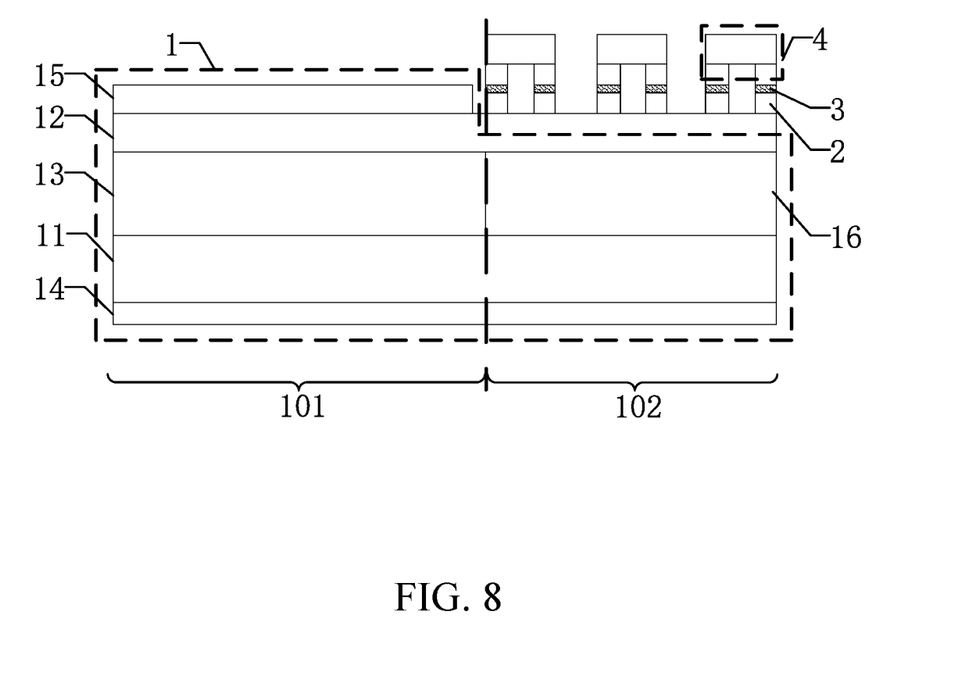
FIG. 8 is a schematic structural diagram of the display device according to embodiment 2 of the present disclosure.

As shown in FIG. 8, the display device 200 of this embodiment includes the LCD display panel 1, the plurality of pad units 2, the plurality of conductive units 3, and the plurality of mini-LEDs 4.

In the display device of this embodiment, the mini-LEDs 4 are manufactured in the bezel area 102 of the LCD display panel 1 to allow the bezel area 102 of the LCD display panel 1 which does not emit light and display originally to display by the mini-LEDs 4, thereby improving the screen ratio of the display device 200, further eliminating the seams between the display areas 101 of the two adjacent LCD display panels 1 of the spliced display device 100, and improving product competitiveness of the spliced display device 100.

As shown in FIG. 8, the LCD display panel 1 is defined with the display area 101 and the bezel area 102.

Wherein, the LCD display panel 1 includes the array substrate 11, the color filter substrate 12, the liquid crystal layer 13, the first polarizer 14, the second polarizer 15, and the sealant 16.

Wherein, the array substrate 11 is disposed in the display area 101 and the bezel area 102. The array substrate 11 includes film layer structures such as the first substrate, the thin film transistor layer, and the first electrode.

Wherein, the color filter substrate 12 is disposed opposite to the array substrate 11, and the color filter substrate 12 is disposed in the display area 101 and the bezel area 102. The color filter substrate 12 includes film layer structures such as the second substrate, the color filter, the black matrix, and the second electrode.

Wherein, the liquid crystal layer 13 is disposed between the array substrate 11 and the color filter substrate 12, and is located in the display area 101.

The first polarizer 14 is disposed on one side of the array substrate 11 away from the color filter substrate 12, and is located in the display area 101 and the bezel area 102. The structure of the first polarizer 14 includes two layers of triacetyl cellulose (TAC) and one polyvinyl alcohol (PVA) layer disposed between the two layers of TAC. It is the PVA layer that plays the role of polarization, but PVA is easily hydrolyzed. In order to protect physical properties of polarizers, it is necessary to laminate one TAC film having high light transmittances, good water resistances, and certain mechanical strengths on both sides of the PVA layer for protection.

The second polarizer 15 is disposed on one side of the color filter substrate 12 away from the array substrate 11, and is located in the display area 101. The structure of the second polarizer 15 includes two layers of triacetyl cellulose (TAC) and one polyvinyl alcohol (PVA) layer disposed between the two layers of TAC. It is the PVA layer that plays the role of polarization, but PVA is easily hydrolyzed. In order to protect physical properties of polarizers, it is necessary to laminate one TAC film having high light transmittances, good water resistances, and certain mechanical strengths on both sides of the PVA layer for protection.

The sealant 16 is disposed between the array substrate 11 and the color filter substrate 12, surrounds the liquid crystal layer 13, and is located in the bezel area 102.

The pad units 2 are disposed spaced apart from each other in the bezel area 102 of the LCD display panel 1. In this embodiment, the pad units 2 are disposed spaced apart from each other on one side of the color filter substrate 12 away from the array substrate 11.

The conductive units 3 are disposed spaced apart from each other on one side of the pad units 2 away from the LCD display panel 1. In this embodiment, the conductive units 3 are disposed spaced apart from each other on one side of the pad units 2 away from the color filter substrate 12. The conductive units 3 are correspondingly electrically connected to the pad units 2 by one to one. wherein, the material of the conductive units 3 is a solder paste. The thickness of the conductive units 3 ranges from 30 um to 60 um. Therefore, electrical connections between the pad units 2 and the mini-LEDs 4 can be well realized.

The mini-LEDs 4 are disposed spaced apart from each other on one side of the conductive units 3 away from the LCD display panel 1. Each of the mini-LEDs 4 includes two connecting ends 41. The connecting ends 41 are correspondingly electrically connected to the conductive units 3 by one to one.

Figure 9:
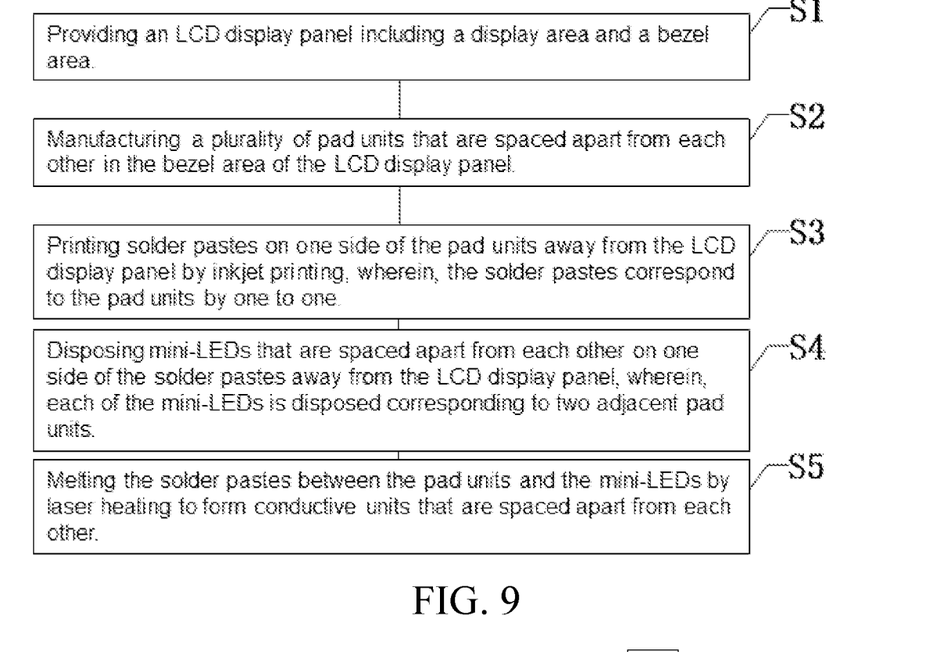
FIG. 9 is a flowchart of manufacturing steps of the display device according to embodiment 2 of the present disclosure.

As shown in FIGS. 4 and 9, the manufacturing method of the display device is further provided in this embodiment, which includes following steps: S1: providing the LCD display panel 1 including the display area 101 and the bezel area 102; and S2: manufacturing the plurality of pad units 2 that are spaced apart from each other in the bezel area 102 of the LCD display panel 1.

Figure 10:
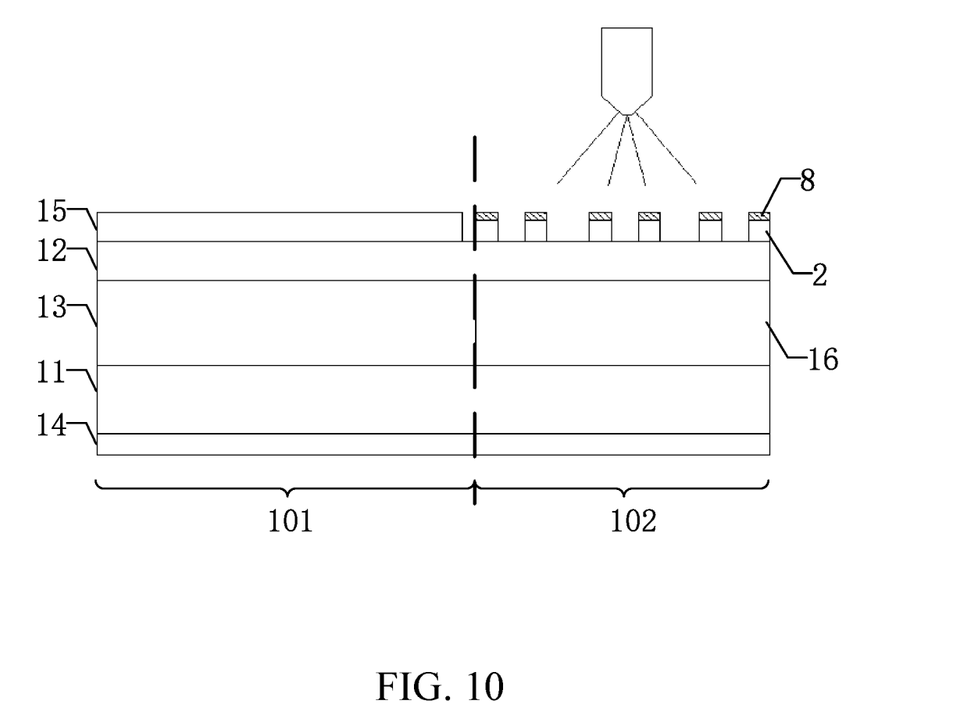
FIG. 10 is a schematic structural diagram of printing solder pastes on the pad units by inkjet printing according to embodiment 2 of the present disclosure.

As shown in FIGS. 9 and 10, the manufacturing method of the display device in this embodiment also includes a step of S3: printing solder pastes 8 on the side of the pad units 2 away from the LCD display panel 1 by inkjet printing, wherein, the solder pastes 8 correspond to the pad units 2 by one to one.

Figure 11:
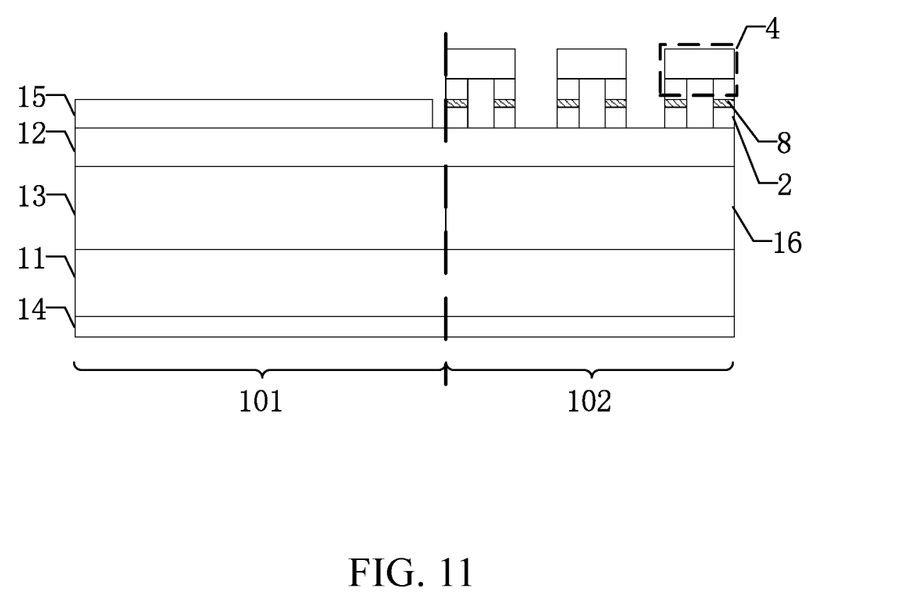
FIG. 11 is a schematic structural diagram of manufacturing the mini-LEDs on the solder pastes according to embodiment 2 of the present disclosure.

As shown in FIGS. 9 and 11, the manufacturing method of the display device in this embodiment also includes a step of S4: disposing the mini-LEDs 4 that are spaced apart from each other on one side of the solder pastes 8 away from the LCD display panel 1, wherein, each of the mini-LEDs 4 is disposed corresponding to two adjacent pad units 2.

Figure 12:
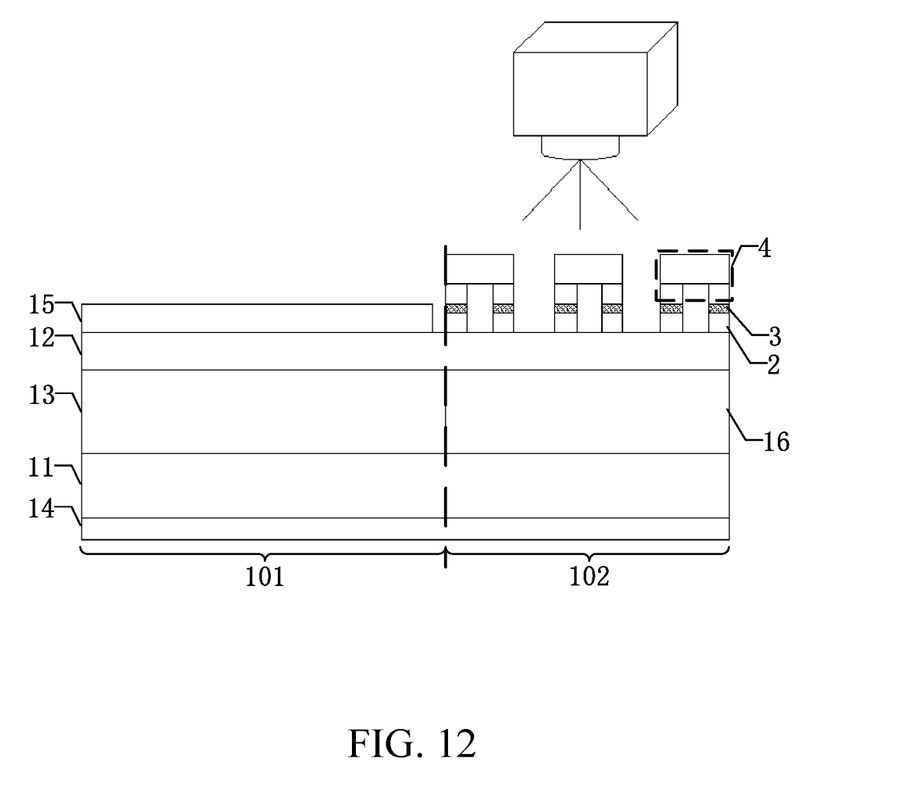
FIG. 12 is a schematic structural diagram of melting the solder pastes between the pad units and the mini-LEDs by laser heating to form the conductive units according to embodiment 2 of the present disclosure.

As shown in FIGS. 9 and 12, the manufacturing method of the display device in this embodiment also includes a step of S5: melting the solder pastes 8 between the pad units 2 and the mini-LEDs 4 by laser heating to form the conductive units 3 that are spaced apart from each other.

Since laser heating can heat locally, the LCD display panel 1 will not be heated together. Therefore, the ghosting phenomenon when the solder pastes are printed in current technology can be prevented, malfunction of the liquid crystal layer 13, the first polarizer 14, and the second polarizer 15 of the LCD display panel 1 caused by reflow soldering in current technology can be prevented, and thereby preventing the display effect of the LCD display panel 1 from being affected.

The manufacturing method of the display device, the display device, and the spliced display device provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A manufacturing method of a display device, comprising following steps:
   providing a liquid crystal display panel (LCD display panel) comprising a display area and a bezel area;
   manufacturing a plurality of pad units spaced apart from each other in the bezel area of the LCD display panel;
   manufacturing a plurality of conductive units spaced apart from each other on one side of the pad units away from the LCD display panel, wherein the conductive units are correspondingly electrically connected to the pad units by one to one, and a material of the conductive units is an anisotropic conductive adhesive;
   melting the anisotropic conductive adhesive film corresponding to the pad units by hot pressing to form the conductive units correspondingly electrically connected to the pad units by one to one and form a plurality of insulating units disposed interlaced with the conductive units through the anisotropic conductive adhesive film not corresponding to the pad units; and
   manufacturing a plurality of mini light-emitting diodes (mini-LEDs) spaced apart from each other on one side of the conductive units away from the LCD display panel, wherein the mini-LEDs are electrically connected to the pad units,
   wherein the step of manufacturing a plurality of conductive units spaced apart from each other on one side of the pad units away from the LCD display panel comprises: attaching an anisotropic conductive adhesive film onto the side of the pad units away from the LCD display panel, wherein the anisotropic conductive adhesive film covers the LCD display panel between adjacent pad units; and
   wherein the step of melting the anisotropic conductive adhesive film corresponding to the pad units by hot pressing to form the conductive units correspondingly electrically connected to the pad units by one to one and form a plurality of insulating units disposed interlaced with the conductive units through the anisotropic conductive adhesive film not corresponding to the pad units comprises:
   heating the anisotropic conductive adhesive film with a mold to melt the anisotropic conductive adhesive film, and squeezing the mini-LEDs and the pad units with the mold to bond the mini-LEDs with the pad units;
   after the hot pressing, rending insulating shells of parts of the anisotropic conductive adhesive film corresponding to the pad units broken to expose internal metal conductive particles, thereby realizing electrical conduction and realizing electrical connections between the pad units and the mini-LEDs, and rending the insulating shells of parts of the anisotropic conductive adhesive film not corresponding to the pad units unbroken and unable to conduct electricity, thereby forming the insulating units.

* * * * *